United States Patent

Tara

[11] Patent Number: 5,270,146
[45] Date of Patent: Dec. 14, 1993

[54] PHOTOSENSITIVE LAMINATE HAVING DUAL INTERMEDIATE LAYERS

[75] Inventor: Vinai M. Tara, Anaheim, Calif.

[73] Assignee: Morton International, Inc., Chicago, Ill.

[21] Appl. No.: 864,837

[22] Filed: Apr. 7, 1992

[51] Int. Cl.$^5$ ............................................. G03C 1/805
[52] U.S. Cl. ........................... 430/259; 430/271; 430/273
[58] Field of Search ............ 430/271, 273, 260, 259, 430/256, 325

[56] References Cited

U.S. PATENT DOCUMENTS

| | | | |
|---|---|---|---|
| 4,239,849 | 12/1980 | Lipson et al. | 430/281 |
| 4,318,957 | 3/1982 | Kuznetsuv et al. | 430/260 |
| 4,530,896 | 7/1985 | Christensen et al. | 430/155 |
| 4,789,620 | 12/1988 | Sasaki et al. | 430/280 |
| 4,889,790 | 12/1989 | Roos et al. | 439/258 |
| 4,987,048 | 1/1991 | Shinozaki et al. | 430/271 |
| 4,992,354 | 2/1991 | Ayon et al. | 430/258 |

*Primary Examiner*—Christopher RoDee
*Attorney, Agent, or Firm*—Wayne E. Nacker; Gerald K. White

[57] ABSTRACT

In a dry film laminate useful in the printed circuit industry comprising a support sheet, a photoimageable composition layer and a protective sheet, a dual intermediate layer is interposed between the photoimageable composition layer and the support sheet. The intermediate layer consists of a water-soluble tie coat in contact with the photoimageable composition layer and a top coat in contact with the support sheet, the top coat being insoluble in neutral or acidic aqueous solution but soluble in dilute alkaline aqueous solution.

6 Claims, 1 Drawing Sheet

FIGURE
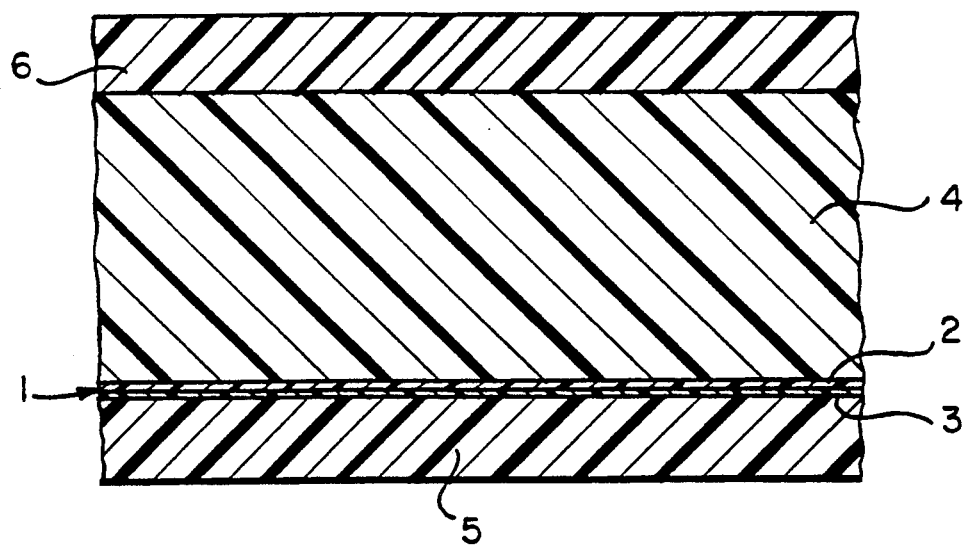

PHOTOSENSITIVE LAMINATE HAVING DUAL INTERMEDIATE LAYERS

The present invention is directed to photosensitive laminates or dry films such as those used in the printed circuit board industry. The dry films may be either those providing primary photoresist layers or those used for forming hard, permanent layers, such as solder masks. In particular, the invention is directed to dry films which contain layers of polymeric materials to protect negative-acting, alkaline aqueous-developable photoimageable composition layers.

BACKGROUND OF THE INVENTION

A basic dry film for applying a photoimageable layer to a substrate, e.g., in the case of a primary resist to a blank for forming a printed circuit board or in the case of a solder mask-forming composition to a printed circuit board, consists of a support or cover sheet, a photoimageable composition layer and a protective sheet. The support sheet is sufficiently flexible to allow the dry film to be rolled, yet has sufficient rigidity to maintain a generally flat configuration when unrolled; this is usually a polyester sheet, e.g., polyethylene terephthalate. The protective sheet overlies the opposite side of the photoimageable composition layer and allows the dry film to be rolled without the photoimageable composition layer sticking to the underside of the support sheet. This invention is particularly directed to photoimageable compositions which are negative-acting and which are developable in alkaline aqueous solution. Primary imaging photoimageable compositions of this type are described, for example, in U.S. Pat. No. 4,239,849, the teachings of which are incorporated herein by reference. Solder mask-forming compositions of this type are described, for example, in U.S. Pat. No. 4,789,620, the teachings of which are incorporated herein by reference. By solder mask is meant herein a hard, permanent layer which meets the abrasion tests as defined in IPC-SM-840A, Table 12, Summary of Criteria for Qualification/Conformance (Institute for Interconnecting and Packaging Electronic Circuits). Photoimageable compositions developable in alkaline aqueous solution comprise a polymeric binder having sufficient carboxylic acid functionality to be soluble in alkaline aqueous solution, a photopolymerizable monomer(s) and a photoinitiator, plus additional components such as thermal stabilizers, fillers, pigments, colorants, etc. When exposed to actinic radiation, the photoinitiator generates free radicals, resulting in polymerization of the monomer. This polymerization renders exposed portions insoluble in alkaline aqueous solution while the unexposed portions remain soluble and are washed away during development in alkaline aqueous solution. Solder-mask forming compositions may also contain an additional chemical system, whereby they may be hardened and made permanent during a post-development cure.

To be used, a dry film is unrolled, the protective sheet is removed, and the tacky photoimageable composition layer is applied to the substrate. In a basic three-layer dry film laminate, the general procedure is to lay artwork on the support sheet and expose the photoimageable composition layer through the support sheet. Then the support sheet is removed, and the photoimageable composition layer is developed.

U.S. Pat. No. 4,530,896 to Christensen et al. and U.S. Pat. No. 4,318,975 to Kuznetsov et al. describe primary imaging dry films which include a layer intermediate the support sheet and the photoimageable composition layer. This intermediate layer is selectively adherent to the photoimageable composition layer, relative to its adherence to the support sheet. The intermediate layer allows the support sheet to be removed prior to exposure. Unlike the photoimageable layer which is generally quite tacky, the intermediate layer may be formed of relatively non-tacky substances. Therefore, artwork can be laid directly on the intermediate layer. Because the intermediate layer can be quite thin relative to the requisite thickness of a support sheet, better resolution is obtainable. Also, the intermediate layer protects the photoimageable layer from oxygen inhibition after the support sheet is removed.

U.S. Pat. Nos. 4,889,790 issued to Roos et al. and 4,992,354 issued to Axon et al., the teachings of which are incorporated herein by reference, teach advantages of solder mask-forming dry films containing such an intermediate layer. Importantly, by allowing removal of the support sheet prior to vacuum lamination, these patents teach that much better conformation of the photoimageable layer to the surface contours of the printed circuit board is achieved.

A number of materials have been proposed for forming the intermediate layer. One commonly used type of material for forming intermediate layers is polyvinyl alcohol, including modified polyvinyl alcohol and polyvinyl alcohol copolymers. Above-referenced U.S. Pat. No. 4,992,354 describes intermediate layers which are mixtures of polyvinyl alcohol or polyvinyl alcohol copolymers with hydroxyethyl cellulose. The intermediate layer is usually selected to be soluble in water so that it is easily and completely removed to allow for rapid development of the underlying photoimageable composition layer.

A problem that has been noted with such intermediate layers is hazing that results from absorption of water vapor in the air. Hazing both reduces light transmission and disperses light that is transmitted, resulting in some loss of photospeed and loss of resolution. In the case of solder mask-forming dry films, the hazing results in reduced gloss in the final product. Lack of gloss in the solder mask is a major cause of poor flux removal property. The present invention addresses the hazing problem and achieves other advantages as set forth hereinafter.

SUMMARY OF THE INVENTION

In a dry film comprising a support sheet, a photoimageable layer, and a protective sheet, a dual intermediate layer is interposed between the support sheet and the photoimageable composition layer. The intermediate layer includes a "top coat" which is adjacent the support sheet and a "tie coat" between the support sheet and the photoimageable composition layer. The top coat is insoluble in water at neutral or acidic pH's, but is soluble in dilute alkaline aqueous solutions and is selected of polymeric materials which do not haze by absorbing water. The tie coat is formed of water-soluble (regardless of pH) material and serves to prevent migration of acrylic monomers, photoinitiators or other solvent-soluble components of the photoimageable composition layer to the top coat.

BRIEF DESCRIPTION OF THE DRAWING

The FIGURE is a cross-sectional view of a dry film in accordance with the present invention.

DETAILED DESCRIPTION OF CERTAIN PREFERRED EMBODIMENTS

Seen in the FIGURE is a dry film laminate in accordance with the invention. The intermediate layer 1 comprises a tie coat 2 and a top coat 3 between the photoimageable layer 4 and the support sheet 5. A protective sheet 6 covers the other side of the photoimageble composition layer 4. The top coat 3 is so named because it becomes the topmost layer when the protective sheet 6 is removed, the photoimageable composition layer 4 is adhered to a substrate surface, and the support sheet 5 is removed.

The support sheet 5 is formed of conventional material, usually a polyester, such as polyethylene terephthalate and is typically between about 20 and about 100 microns thick. It's surface which contacts the top coat 3 may be modified to adjust its adherence to the top coat. The protective sheet 6 is likewise formed of a conventional material, such as polyethylene, having minimal adherence to the photoimageable composition layer 4.

The protective sheet 6 is the first layer removed so that the photoimageable composition layer 4 may be adhered to a substrate. The protective sheet 6 must have sufficiently low adherence to the photoimageable composition layer 4 that it can be removed without separating the remaining layers or disturbing any of the remaining layers. After the protective sheet 6 is removed and the photoimageable composition layer 4 is firmly adhered to a substrate (such as a copper clad epoxy board or a printed circuit board, as the case may be) the protective sheet is the next layer removed. Accordingly, while its adherence to the top coat 3 is greater than the adherence of the protective sheet 6 to the photoimageable layer 4, its adherence to the top coat 3 must be substantially less than the adherences between the photoimageable composition layer 4 and the substrate; the photoimageable layer and the tie coat 2; and the tie coat and the top coat 3. Likewise, the support sheet 6 should be removable from the top coat 3 without disturbing any of the remaining layers. Also, the adherence of the photoimageable composition layer 4 to a prospective substrate must be greater than the adherence of the support sheet 6 to the top coat 3.

The photoimageable composition layer 4 may be either a primary imaging resist for forming a printed circuit board or may be a composition that may be rendered hard and permanent to serve as a solder mask or the like. Typically the photoimageable layer is between about 40 and about 200 microns thick. The invention is specifically directed to photoimagable composition layers which are negative-acting, alkaline aqueous-developable e.g., as described in patents referenced above. Such compositions are well known in the art and will not be described in detail herein, the basic components of such compositions being set forth above.

To overcome the hazing problem exhibited by prior art water-soluble intermediate layers, the top coat 3 is formed of polymeric material which does not absorb water. Therefore, a material is selected which is not soluble in water at neutral pHs. On the other hand, it is necessary that the top coat 3 be removed during development to allow the developer to wash away the unexposed portions of the photoimageable composition layer. Accordingly, it is necessary that the top coat be soluble in dilute alkaline aqueous solution, such as a 1% sodium carbonate solution. To this end, the top coat is formed of polymeric material similar to polymeric materials used as binders in alkaline aqueous-developable photoimageable compositions. Particularly, polymers formed from alpha, beta-ethylinically unsaturated monomers, such as acrylate esters, acrylic acids, styrenes and substituted styrenes are suitable. Suitable specific monomers useful in forming such polymers are described in above-referenced U.S. Pat. No. 4,239,849. Currently preferred monomers for forming the top coat polymer include $C_1$–$C_4$ alkyl acrylate, methacrylate and ethacrylate; acrylic, methacrylic and ethacrylic acid; and styrene and methyl styrene. To provide solubility in alkaline aqueous solutions, the polymer should have sufficient carboxylic acid functionality to give an acid number of at least about 50. Typically, the acid number ranges from about 50 to about 200; however, the top coat material may have even higher acid numbers. The molecular weights (weight average) of top coat polymers are usually in the range of from about 20,000 to about 200,000.

Although the top coat 3 is similar in composition to the binder polymer of the photoimageable composition layer 4, the top coat is substantially different in nature from the photoimageable composition layer. While the photoimageble composition layer, which contains monomer, photoinitiator, heat stabilizers, etc., is a semi-solid with substantially no structural integrity, the much thinner top coat 3 is a solid with some structural integrity.

On the other hand, because the polymer of the top coat 3 is similar to the binder polymer of the photoimageable composition layer, it is necessary to separate the layers by the tie coat 2, lest monomers, photoinitiator, etc. migrate from the photoimageable composition layer to the top coat, either during application or during storage. The tie coat 2 is preferably formed of polyvinyl alcohol, modified polyvinyl alcohol (including polyvinyl alcohol copolymers) or a mixture of polyvinyl alcohol (at least about 10 wt. percent) and additional water-soluble polymer, such as hydroxyethyl cellulose, polyvinyl acetate and water-soluble polysaccharides, such as starch. The currently preferred material for use in the present invention is homogeneous polyvinyl alcohol. By polyvinyl alcohol is meant herein a polymerized ester of polyvinyl alcohol (such as polyvinyl acetate) which is suponified to at least about 80%. A polyvinyl alcohol copolymer/hydroxyethylcellulose layer is described in above-referenced U.S. Pat. No. 4,992,354.

The total thickness of the intermediate layer 1 is between about 4 and about 12 microns, preferably between about 6 and about 8 microns. The tie coat 2 is between about 1 and about 8 microns, preferably between about 3 and about 6 microns thick. The top coat 3 is between about 1 and about 8 microns, preferably between about 3 and about 6 microns thick. In manufacturing the dry film of the present invention, the tie coat is applied as an aqueous solution over the photoimageable layer. Subsequently, the top coat is applied over the top coat, either as an aqueous dispersion or as an organic solvent solution. The other layers of the dry film laminate are formed in the conventional manner.

As discussed above, the dual intermediate layer 1 overcomes the hazing problem by providing a water-insoluble top coat 3, which is the layer exposed to air after the photoimageble composition layer 4 has been applied to a substrate and the support sheet 5 removed. The dual intermediate layer 1 is found to have additional advantages. The dual intermediate layer has been found to be more impervious to oxygen than prior art intermediate layers. As oxygen inhibits polymerization, a greater photospeed can be achieved by the dry film of the present invention. If the photoimageable composition layer 4 is a solder mask-forming composition, the dual intermediate layer 1 contributes to the ability of the material to tent thru-holes. While the semi-solid photoimageable composition layer 4 has little structural integrity, both the top coat 3 and tie coat 2 have structural integrity which contributes to tenting ability. The strength of the intermediate layer structure is increased by the fact that two dissimilar types of compositions are bonded together.

The invention will now be described in greater detail by way of specific examples,

EXAMPLE 1

A dry film is formed of a support sheet which is polyethylene terephthelate (40 microns thick), a top coat which is a copolymer of 36.5 wt. % methyl methacrylate, 20.4 wt. % butyl acrylate, 14.5 wt. % styrene and 28.6 wt. % methacrylic acid (1.25 microns thick), a polyvinyl alcohol tie coat (1.25 microns thick), an alkaline aqueous-developable photoimageable composition layer (92 microns thick) sold under the trade designation HG by Dynachem, Tustin, Calif., and a polyethylene cover sheet (40 microns thick).

EXAMPLE 2

A solder mask-forming dry film (control) sold by Dynachem under the trademark CONFORMASK has an alkaline aqueous-developable photoimageable composition that is post-curable to form a solder mask. The intermediate layer in this film is 2.5 microns thick and is a mixture of hydroxyethyl cellulose (95 wt. %) and polyvinyl alcohol (5 wt. %). An identical dry film (dual layer) was prepared but with the intermediate layer replaced by a polyvinyl alcohol tie coat (1.25 microns thick) and a top coat as described in Example 1 (1.25 microns thick). After application of the photoimageable composition layers to printed circuit boards and removal of the support sheets, the panels were held at (condition A) for 2 hours at 63 F.°, 52% RH and (condition B) for 2 hours at 71° F., #45% RH. Processing conditions are as follows:

PROCEDURE

| PANEL NO | FILM | POST CFU-III HOLDING ROOM |
|---|---|---|
| 1 | Control | Condition A |
| 2 | Control | Condition A |
| 3 | Control | Condition B |
| 4 | Control | Condition B |
| 5 | Dual Layer | Condition A |
| 6 | Dual Layer | Condition A |
| 7 | Dual Layer | Condition B |
| 8 | Dual Layer | Condition B |

PANEL DESCRIPTION

| | |
|---|---|
| Size | 18" × 24" × 0.062" |
| Design | 10 mil line and space double sided |
| Metalization | Sn/Pb |
| Base Material | FR-4 |
| Circuit Height | <4.0 mils |
| Tented Via Holes | 30 and 40 mils |

PROCESSING ENVIRONMENT

| | Condition A | Condition B |
|---|---|---|
| 1. Lighting | Yellow Light | Yellow Light |
| 2. Temperature | 63° F. | 71° F. |
| 3. Relative Humidity | 52% | 45% |
| 4. Gns H₂O/# Dry Air | 45 | 51 |

VACUUM LAMINATION

| | |
|---|---|
| Vacuum Laminator | VA 724 |
| Cycle Time | 60 sec |
| Slap Time | 5 sec |
| BST | |
| Top | 128° F. (64° C.) |
| Botto | 125° F. (64° C.) |
| Vacuum | 0.6 mbars |
| Free Space | 0.04 inches |

POLYESTER REMOVAL

Less than 30 seconds and parallel to the board surface and in the direction of the circuit lines.

FINISHING CFU III

| | |
|---|---|
| 1. Cooling Time | 80 sec |
| 2. Panel Temperature | 45° C. Approx |
| 3. Conveyor Speed | 500 |
| 4. Chamber Temperature | 43° F. |
| 5. H.R. Temperature | Not Utilized |
| 6. H.R. Pressure | Not Utilized |
| 7. Hold Time | 120 minutes |

EXPOSURE

| | | |
|---|---|---|
| 1. | Unit Power | Colight 1230 5KW |
| | Exposure Time | 35 seconds (Integrator Value of 50/50) |
| | Vacuum | 75 mm Hg |
| | Phototool | Transpoque G2 Clear Diazo (No Image Blank Exposed) |

DEVELOPMENT

| | | |
|---|---|---|
| 1. | Develop | Chemcut 547 Horizontal chamber length of 36 inches. |
| | Solution | 1.0% Na₂CO₃ Approx not measured |
| | Temperature | 85° F. |
| | Breakpoint | 50% Approx not measured |
| | Speed Set Pt. | 2.4 |
| | Developing Time | 130 seconds |
| | Spray Pressure | 25 psi |
| 2. | Spray Rinse | |
| | Chamber Length | 50% Developing chamber length minimum |
| | Spray Pressure | 25 psi |
| 4. | Turbine Dry | |

RESULTS

| PNL NO | SST | A/W TACK | 60° GLOSS | TENTING (% BROKEN) | FOGGING |
|---|---|---|---|---|---|
| 1 | 13 | NONE | 89% | <2% | NONE |
| 2 | 13 | NONE | | <2% | NONE |
| 3 | 13 | NONE | | <2% | NONE |
| 4 | 13 | NONE | | <2% | NONE |
| 5 | 10 | SLIGHT | 74% | 15-20% | SLIGHT |
| 6 | 10 | SLIGHT | | 15-20% | SLIGHT |
| 7 | 10 | SLIGHT | | 15-20% | SLIGHT |
| 8 | 10 | SLIGHT | | 15-20% | SLIGHT |

SST = Stoufer Step    A/W = Art Work

OBSERVATIONS/DISCUSSION

1. The dual layer exhibited at 15% higher gloss compared to the control. This is helpful in eliminating flux residues as well as preventing solder balling with low solids fluxes.
2. There was no artwork tack to the dual layer panel either during registration or after exposure. This allows for easy eyeball registration and results in a smooth consistent surface finish.
3. Starring was significantly reduced to the dual layer but not eliminated.

4. The photospeed of the dual layer was found to be 3 Stouffer Steps higher over the 2 hour hold time.
5. The resistance of the dual layer surface to marring was greatly enhanced compared to the control.
6. No fogging was noted on the dual layer. An undesirable level of fogging was noted on the control which should not have been apparent under the recorded environmental conditions.
7. A major advantage of the dual layer was seen in its enhanced tenting performance.

While the invention has been described in terms of certain preferred embodiments, modifications obvious to one with ordinary skill in the art may be made without departing from the scope of the present invention.

Various features of the invention are set forth in the following claims.

What is claimed is:

1. A dry film laminate comprising
   (a) a protective sheet,
   (b) a negative-acting, photoimageable composition layer that is developable in dilute alkaline aqueous solution,
   (c) a dual intermediate layer comprising
      (c-1) a water-soluble tie coat layer and
      (c-2) a top coat layer which is insoluble in neutral or acidic aqueous solution but which is soluble in dilute alkaline aqueous solution, said tie coat (c-1) being formed of materials, which prevent migration of solvent-soluble components of said photoimageable layer (b) to said top coat (c-2) and said top coat (c-2) being formed of polymeric materials which do not haze by absorbing water, and
   (d) a support sheet;
   said protective sheet (a) having such minimal adherence to said photoimageable composition layer (b) that said protective sheet may be removed from said photoimageable composition layer without disruption of any of the other layers or the bonds therebetween; and the adherence of said support (d) to said top coat (c-2) being such that said support sheet (d) may be removed from said top coat (c-2) without disruption of any remaining layers, the bonds between such remaining layers and a bond formed between said photoimageable composition layer (b) and a substrate.

2. A dry film laminate according to claim 1 wherein said top coat (c-2) is a polymer formed of alpha, beta-ethylenically unsaturated monomers and has an acid number of at least about 50.

3. A dry film laminate according to claim 2 wherein said tie coat (c-1) is formed of between about 10 and 100 wt. percent of a material selected from the group consisting of polyvinyl alcohol, modified polyvinyl alcohol, polyvinyl alcohol copolymers and from 0 to about 90 wt. percent of compatible, water-soluble polymeric material.

4. A dry film laminate according to claim 1 wherein said tie coat (c-1) is formed of between about 10 and 100 wt. percent of a material selected from the group consisting of polyvinyl alcohol, modified polyvinyl alcohol, polyvinyl alcohol copolymers and from 0 to about 90 wt. percent of compatible, water-soluble polymeric material.

5. A dry film laminate in accordance with claim 1 wherein said intermediate layer (c) is between about 4 and about 12 microns thick.

6. A dry film laminate in accordance with claim 5 wherein said tie coat (c-1) is between about 1 and about 8 microns thick and said top coat (c-2) is between about 1 and about 8 microns thick.

* * * * *